US010197703B2

(12) United States Patent
Deschamps et al.

(10) Patent No.: US 10,197,703 B2
(45) Date of Patent: Feb. 5, 2019

(54) METHOD FOR EXPLOITING A SUBSURFACE DEPOSIT COMPRISING AT LEAST ONE GEOLOGICAL OUTCROP BY MEANS OF PHOTOGRAMMETRY

(71) Applicant: IFP Energies nouvelles, Rueil-Malmaison (FR)

(72) Inventors: Remy Deschamps, Montesson (FR); Julien Schmitz, Montesson (FR); Jean-Marc Daniel, Chatou (FR); Philippe Joseph, Marly le Roi (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 956 days.

(21) Appl. No.: 14/476,894

(22) Filed: Sep. 4, 2014

(65) Prior Publication Data

US 2015/0066465 A1    Mar. 5, 2015

(30) Foreign Application Priority Data

Sep. 4, 2013   (FR) ...................................... 13 58480

(51) Int. Cl.
| | | |
|---|---|---|
| *G06G 7/50* | (2006.01) | |
| *G01V 99/00* | (2009.01) | |
| *G06F 17/50* | (2006.01) | |
| *G01C 11/06* | (2006.01) | |
| *G01V 8/02* | (2006.01) | |
| *G01V 9/00* | (2006.01) | |

(52) U.S. Cl.
CPC ............ *G01V 99/005* (2013.01); *G01C 11/06* (2013.01); *G01V 8/02* (2013.01); *G01V 9/005* (2013.01); *G06F 17/5009* (2013.01)

(58) Field of Classification Search
CPC ........ G01V 99/005; G01V 9/005; G01V 8/02; G01C 11/06; G06F 17/5009
USPC ........................................................ 703/9, 10
See application file for complete search history.

(56) References Cited

U.S. PATENT DOCUMENTS

| | | | | |
|---|---|---|---|---|
| 7,369,980 | B2 * | 5/2008 | Deffenbaugh | ........... E21B 49/00 703/10 |
| 2005/0279532 | A1 * | 12/2005 | Ballantyne | .............. E21B 47/12 175/40 |
| 2009/0070086 | A1 * | 3/2009 | Le Ravalec | .............. G01V 1/30 703/10 |
| 2009/0262603 | A1 * | 10/2009 | Hurley | ................... G01V 11/00 367/86 |
| 2011/0181610 | A1 * | 7/2011 | Baggs | ................... G06T 11/001 345/589 |

* cited by examiner

*Primary Examiner* — Andre Pierre Louis
(74) *Attorney, Agent, or Firm* — Fitch, Even, Tabin & Flannery LLP

(57) ABSTRACT

The invention relates to a method for exploiting (EXP) a subsurface deposit comprising at least one outcrop, the exploitation (EXP) of the deposit is based on a geological model (MOD) formed from a photogrammetry. The method reconstructs the geological outcrops in three dimensions (R3D) from photographs (PHO), and interprets the geological elements thereof, such as the sedimentary surfaces, the geological facies, the fault lines and the fractures, the inclination of the beds, etc. to construct a geological model of the deposit (MOD).

15 Claims, 2 Drawing Sheets

METHOD FOR EXPLOITING A SUBSURFACE DEPOSIT COMPRISING AT LEAST ONE GEOLOGICAL OUTCROP BY MEANS OF PHOTOGRAMMETRY

CROSS REFERENCE TO RELATED APPLICATION

Reference is made to French Application Serial No. 13/476.894, filed Sep. 4, 2014, which application is incorporated herein by reference in its entirety.

BACKGROUND OF THE INVENTION

Field of the Invention

The present invention relates to characterizing equivalents of a subsurface deposit, such as a hydrocarbon reservoir, a mining deposit or a quarry, from a geological model.

Description of the Prior Art

The oil industry, and more particularly the exploration and exploitation of oil deposits, requires the acquisition of a knowledge that is an accurate as possible description of the subsurface geology to effectively provide an assessment of the reserves, a modeling of the production, or optimized management of the exploitation. In effect, determining the placement of a production well or of an injection well, the parameters needed for the optimum recovery of the hydrocarbons, such as the injection pressure, the make-up of the drilling mud, the completion characteristics, etc. all require a good knowledge of the deposit. Knowing the deposit means knowing the characteristics of the subsoil at all points of its space. This entails knowing the architecture of the subsoil which requires a definition of the geometry and the nature of the geological beds that make up this subsoil. The complexity of the sedimentary architecture of a reservoir creates difficulties in modeling the deposit. Different surfaces intersecting due to the succession of fillings and erosions can in particular be observed. The geological architecture thus defines different geological objects, to which petrophysical properties can be attached to improve the characterization of the deposit, and therefore the various assessments.

For a long time, the oil industry has associated technical measures with modelings, produced in a laboratory and/or by software, notably by use of an analysis of the outcrops of the deposit.

In geology, an outcrop is a set of rocks that are not separated from the subsoil, which has been stripped bare by a range of natural factors (hydraulic, glacial or marine erosion) or human factors. The studies of similar outcrops and/or outcrops linked to the subsurface deposits, that is to that have the same characteristics in terms of geological age, of deposit conditions and environment, of rock type, etc., as the deep deposit make it possible to acquire a more detailed understanding of their geometry, heterogeneities and petrophysical characteristics.

Furthermore, the study of outcrops can also be useful in modeling mining deposits or in modeling quarries in order to optimize their exploitation.

Modelings of equivalents of deposit outcrops therefore constitute a technical step that is essential to any deposit exploration or exploitation. The goal of these modelings is to provide a description of the deposit, via its sedimentary architecture and/or its petrophysical properties.

The recent keen interest in 3D (three-dimensional) representation of outcrops has spurred the development of 3D outcrop reconstruction techniques, including Lidar (light detection and ranging), for which numerous efforts and means have been implemented to incorporate this technology in the geological modeling methods. This method has been proven, and while it makes it possible to have a 3D reconstruction of the outcrops that is accurate, it does in practice however prove very difficult to use and to manipulate. In practice, the cloud of points generated on the images to be manipulated is significant, the computing power needed is sizable, which significantly reduces the flexibility of use of this method. Moreover, the Lidar acquisition devices are heavy (several tens of kilograms of equipment to be taken into the field, more often than not brought by a helicopter), which makes this method very restricting and very costly.

SUMMARY OF THE INVENTION

To mitigate this costly method in terms of acquisition and processing power, as well as handling weight, the invention relates to a method for exploiting a subsurface deposit comprising at least one outcrop for which the exploitation of the deposit is based on a geological model formed from photogrammetry. The method reconstructs the geological outcrops in three dimensions from photographs, and in order to interpret the geological elements thereof, such as the sedimentary surfaces, the geological facies, the fault lines and the fractures, the inclination of the beds, etc., a geological model of the deposit is constructed. The acquisition of the data by this method is inexpensive and versatile to use.

The invention relates to a method for exploiting a subsurface deposit comprising at least one geological outcrop. For this method, the following steps are carried out:
a) Acquiring at least two georeferenced photographs of the at least one geological outcrop;
b) Constructing a three-dimensional representation of the at least one geological outcrop from the georeferenced photographs;
c) Determining at least one characteristic of the at least one outcrop by use of the three-dimensional representation of the outcrop;
d) Constructing a geological model of the subsurface deposit by use of the at least one characteristic of the at least one outcrop; and
e) exploiting the subsurface deposit by use of an exploitation scheme of the subsurface deposit using the geological model.

According to the invention, the characteristic of the at least one outcrop is at least one of geological, geometrical, statistical and geostatistical nature.

Advantageously, the characteristic of the at least one outcrop is chosen from a definition of surfaces defining at least one of geological units of the outcrop, a definition of at least one of the surfaces of fault lines and fractures, a geometry of different geological bodies and a definition of sedimentary facies.

According to one embodiment of the invention, the three-dimensional representation of the at least one outcrop is constructed using a reconstruction algorithm obtained from the georeferenced photographs.

Preferably, the reconstruction algorithm implements the following steps:
i) determining at least one parameter relating to the photographic exposures;

ii) determining a depth of the at least one outcrop by use of the georeferenced photographs and the at least one parameter; and iii) constructing a three-dimensional representation as a function of the depth of the at least one outcrop and of the georeferenced photographs.

Advantageously, the characteristic of the at least one outcrop is determined by applying an image processing method to the three-dimensional representation.

Furthermore, the three-dimensional representation can be analyzed statistically to determine at least one set of geostatistical parameters to constrain the geological model.

Advantageously, dimensions of at least one of sedimentary bodies, of heterogeneities, of fault lines and fractures of the at least one outcrop are analyzed.

Advantageously, the georeferenced photographs are acquired from at least one of the ground and the air.

According to the invention, the subsurface deposit is a hydrocarbon reservoir, a mining deposit or a quarry.

Furthermore, the invention relates to a computer program product from at least one of downloading from a communication network storage on a computer-readable medium and execution by a processor, comprising program code instructions for implementing the method according to the invention, when the program is run on a computer.

BRIEF DESCRIPTION OF THE DRAWINGS

Other features and advantages of the method according to the invention will become apparent FROM reading the following description of nonlimiting exemplary embodiments, with reference to the attached figures described hereinbelow.

DETAILED DESCRIPTION OF THE INVENTION

The invention relates to a method for exploiting a subsurface deposit (hydrocarbon reservoir for the recovery of hydrocarbons and for the storage of $CO_2$, mine, quarry) for which a geological model of the deposit is constructed by determining certain characteristics on a geologically analogous outcrop, and on a basis of a photogrammetry method.

It should be noted that, in geology, an outcrop is a set of rocks that are not separated from the subsoil, which has been stripped bare by a range of natural factors such as hydraulic, glacial or marine erosion or human factors.

Photogrammetry is a measurement technique for which the coordinates in three dimensions of the points of an object (here, an outcrop) are determined by measurements made in two (or more) photographic images taken from different positions.

A geological model (or reservoir model) is a representation of the spatial distribution of the geological and petrophysical properties such as the facies, the permeabilities or the porosities of a subsurface deposit. Such a geological model constitutes a modeling of the subsoil, representative both of its structure and of its behavior. Generally, this type of modeling is represented on a computer as a digital model. A digital geological model is based on a grid (or mesh), generally three-dimensional, whose geometry represents that of the object under studied (here the subsurface deposit), and in which geological and petrophysical properties (facies, porosity, permeability, saturation, etc.) are associated with each mesh. The geological models and the reservoir models that are well known and widely used in the oil industry make it possible to determine numerous technical parameters relating to the study or the exploitation of a reservoir, of hydrocarbons for example. In practice, since the geological model is representative of the structure of the reservoir and of its behavior, the engineer uses it in the field of hydrocarbon recovery for example to determine the areas which have the best chances of containing hydrocarbons, the areas in which it may be interesting or necessary to drill an injection or production well to improve the recovery of the hydrocarbons, the type of tools to be used, the properties of the fluids used and recovered, etc. These interpretations of geological models in terms of "technical exploitation parameters" are well known. The function of a geological model is therefore to best report all the known information concerning a subsurface deposit. A digital geological model is representative of the reality when a reservoir (production) simulation for this model provides results in terms of production history that are very close to the observed data. A reservoir simulation is a technique which makes it possible to simulate the flows of fluids in a reservoir using flow simulator software, and the reservoir model. For example, the PumaFlow™ software (IFP Energies nouvelles, France) is a flow simulator.

Figure 1:
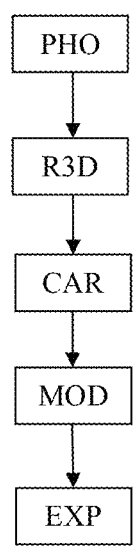
FIG. 1 illustrates the steps of the method according to the invention.

According to the invention, and as represented in FIG. 1, the method for exploiting a subsurface deposit comprising at least one geological outcrop comprises the following steps:

1. Acquiring of photographs (PHO)
2. Constructing a three-dimensional representation of the outcrop (R3D)
3. Determining the characteristics of the outcrop (CAR)
4. Constructing a geological model (MOD)
5. Exploiting the subsurface deposit (EXP)

Figure 2:
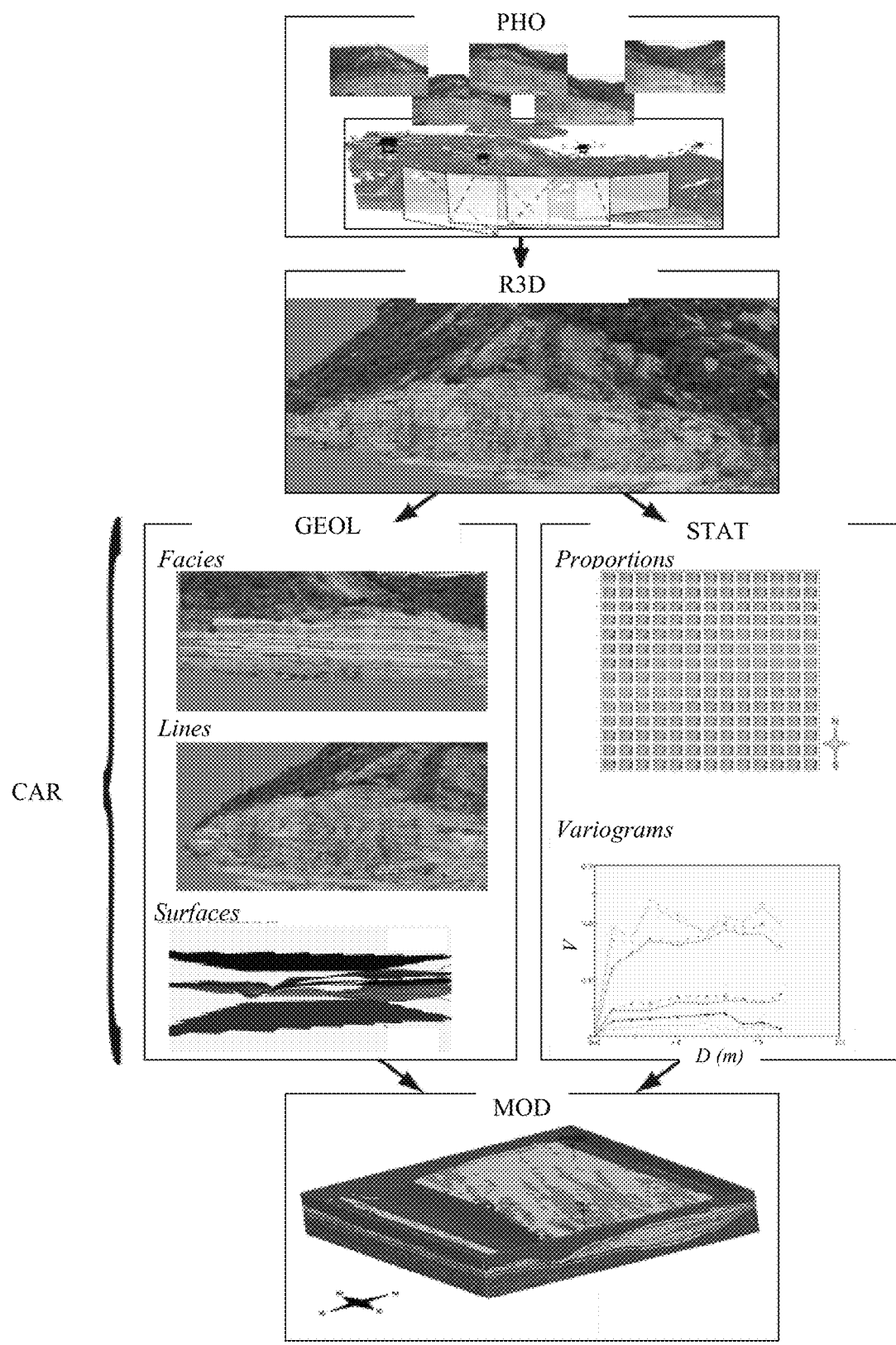
FIG. 2 illustrates an example of the method according to the invention.

FIG. 2 illustrates these steps in an exemplary application.

1. Acquisition of Photographs (PHO)

The first step acquires the input data for the construction of the three-dimensional representation of the outcrop. These data are at least two, preferably at least three, photographic exposures of the outcrops on the terrain. Each exposure is georeferenced, that is to say positioned in space (in three dimensions), in order to be able to reposition the 3D representation or representations of outcrops in a geographic space, as they are in reality.

The exposures can be from land or from the air, notably on board a helicopter or by a remote-controlled drone.

Advantageously, the photographs can be taken according to a precise protocol which provides an accurate 3D reconstruction of the surface of the textured outcrop. The protocol may notably provide for an overlapping of the photographs.

The acquisition of the data by this method does not therefore require any costly and heavy equipment with simply a digital camera sufficing. Furthermore, the acquisition of the data by this method does not require any significant computing power, and, consequently, this method is inexpensive and versatile to use.

In FIG. 2, the acquisition step (PHO) illustrates five aerial photographs of an outcrop and the areas of the outcrop which are photographed. These areas are overlapped for a better reconstruction of the outcrop.

2. Construction of a Three-Dimensional Representation of the Outcrop (R3D)

This step relates to the 3D reconstruction of the photographed outcrops. This reconstruction is done by a photogrammetric reconstruction algorithm, which takes into account the photographs and their georeferencing. With respect to the photogrammetric reconstruction, the coordinates in three dimensions of the points of the outcrop are determined by measurements made by at least two photographic images taken from different positions, by using the parallax between the images. The three-dimensional representation obtained at the end of this step is a 3D image of the outcrop. The reconstruction algorithm can take into account the technical data relating to the photographic exposures, notably the focal distance of the lens of the camera.

The reconstruction process can be summarized in 4 steps:

a— Calibration of the camera:

This step determines the intrinsic parameters (focal length, image size and main point) and extrinsic parameters (georeferencing—position of the camera in real 3D coordinates) of the camera being used.

b— Computation of the depth

This part of the computation will determine the depth of the objects represented in the 2D images (photos). Different depth maps can thus be computed.

c— Reconstruction and meshing:

The different depth maps generated previously are used to reconstruct the model as a whole. The cloud of points resulting from this computation can then be triangulated to obtain the final meshing.

d— Extraction of texture:

This last step extracts the textures from the original photos and applies them to the meshing obtained in the preceding step in order to create the meshed and textured model that can be used for the subsequent steps. In the field of image synthesis, a texture is an image in two dimensions (2D) that will be applied to a surface (2D) or a volume in three dimensions (3D) to clad this surface or this volume.

For example, for this reconstruction, photogrammetric reconstruction software can be used, such as the Smart3DCapture™ software (Acute 3D, France).

The step of construction of a three-dimensional representation (R3D) is illustrated for an example in FIG. 2.

3. Determination of the Characteristics of the Outcrop (CAR)

The third step relates to the use of the 3D representation of the outcrop, with the interpretation and the editing of the geological elements being observed and described on the terrain. It involves editing, on the 3D model, characteristics which are useful for constraining the geological models, that is to say determining one or more geological, geometrical, statistical or geostatistical characteristics of the outcrop. For this, an image processing method is used which processes the three-dimensional representation of the outcrop constructed in the preceding step.

Advantageously, this image processing method is carried out by computer and offers the following interactive possibilities: picking (i.e. determining an object on an image by the user clicking to select), cladding the 3D image with classes of textures (regions of characteristics, patterns, ranges of colors, etc. that are uniform), filtering, automatically recognizing shapes, etc. It should be noted that, in the field of image synthesis, a texture is an image in two dimensions (2D) that will be applied to a surface (2D) or a volume in three dimensions (3D) to clad this surface or this volume.

According to one embodiment of the invention, the determined characteristic may relate to:

the noteworthy surfaces defining geological units exhibiting distinct characteristics;

the construction of surfaces and of regions corresponding to geological units exhibiting characteristics which consequently induce distinct simulation methods;

the construction of surfaces corresponding to fault line and/or fracture corridors by observing their orientations in space;

the geometries of the different geological bodies (channels, truncations, clinoforms, fault throws, fracture corridors, etc.); and the sedimentary facies (reservoir facies, heterogeneities, etc.).

This list is not exhaustive.

Furthermore, statistical analyses and computations of geostatistical parameters of properties interpreted on the representation of the outcrop in 3D can be implemented, in order to provide a set of geostatistical parameters and of constraints that is as complete as possible for the construction of the geological model. Advantageously, this analysis can take place independently following the second step of construction of the three-dimensional representation. The goal in this part is to analyze and quantify certain geological attributes on the 3D outcrop image statistically in addition to the editing of the abovementioned geological elements.

The image analysis part makes possible quantifying the size of the geological objects (dimensions of the sedimentary bodies, of the reservoir heterogeneities, spacing of the fractures, distribution of the fault lines and fractures in space, etc).

The part of quantification of the elements and geological properties interpreted on the 3D outcrop relates to the geostatistical tools which make it possible to compute the most important parameters used for the reservoir modeling. It involves directly computing, on the outcrop, the proportion curves as well as the proportion matrices of the properties interpreted on the outcrop (facies, etc.), as well as the variograms, which then serve directly as geostatistical constraints for the construction of the geological model.

The step of determining characteristics of the outcrop (CAR) is illustrated in FIG. 2 for example. For this example, the determination of geological characteristics (GEOL) of the outcrop and a statistical analysis (STAT) are both performed. For the determination of geological characteristics (GEOL), a first step of facies recognition is performed, followed by a second step of line construction (polyline drawing) and a surface construction step. For the statistical analysis (STAT), the proportions of the make-up of the ground (clay, sandstone, mud, conglomerates, etc.) are estimated and their variograms (V) can be formed as a function of the distance (D).

4. Construction of a Geological Model (MOD)

In this step, a geological model (or, if appropriate, a reservoir model) is constructed of the subsurface deposit. The model is constrained on the outcrop by the characteristics and the constraints determined in the preceding step. In practice, the purpose of the modelings of the outcrop is to provide a description of the deposit, via its sedimentary architecture and/or its petrophysical properties.

These characteristics and these constraints provide a panel of geometrical, faciological, statistical and geostatistical constraints which can be exported directly into geomodelers such as Petrel™ (Schlumberger, USA) or Gocad™ (Paradigm, USA).

The geological model can also be constrained by other data acquired on the subsurface deposit which, for example, can be by production data at the well in the context of hydrocarbon recovery, by petrophysical data at the wells, etc.

The step of construction of the geological model of FIG. 2 illustrates the model obtained following the preceding steps by using a geomodeler known as Petrel™ (Schlumberger, USA) or Gocad™ (Paradigm, USA) type.

5. Exploitation of the Subsurface Deposit (EXP)

If the deposit is a hydrocarbon reservoir, a flow simulator, for example the PumaFlow™ software (IFP Energies nouvelles, France), is used to simulate the flows of the injected fluid and of the hydrocarbons present in the reservoir based on the reservoir model chosen in the preceding step. The recovery of oil or the displacements of the fluids (for example the stored gases) in the reservoir can, for example, be simulated.

According to one embodiment of the invention, based on the reservoir model determined in the preceding steps, a number of exploitation schemes can be determined corresponding to different possible exploitation configurations of the subsurface reservoir, such as placement of the production and/or injection wells, target values for the flow rates for each well and/or for the reservoir, the type of tools used, the fluids used which are injected and/or recovered, etc. For each of these schemes, their production forecasts should be determined. These probabilistic production forecasts are obtained by use of the flow simulation software and by use of the selected digital reservoir model.

One or more possible exploitation schemes suited to the reservoir model are then defined. For each of these schemes, the responses can be determined by simulation.

Based on the probabilistic production forecasts defined for each exploitation scheme, the exploitation scheme which seems most relevant is chosen by comparison. For example:

Choosing the scheme is determined by comparing the maximum of the volume of oil recovered, which makes possible determination of the production scheme likely to provide the maximum recovery or be the most profitable.

Choosing the scheme is determined by comparing a standard deviation of a volume of oil recovered which makes possible determination of the least risky production scheme.

The reservoir is then exploited according to the simulation or, if appropriate, according to the most relevant exploitation scheme, for example by drilling new wells (production or injection), by modifying the tools used, by modifying the flow rates and/or the nature of fluids injected and/or stored (case of $CO_2$ storage), etc.

If the subsurface deposit is a mining deposit or a quarry, the geological model is used to determine the areas of interest for the exploitation of the deposit. Based on these areas, one or more exploitation schemes for the subsurface deposit are defined, by taking into account the operating conditions: quantity of material that can be recovered, quantity of material that cannot be exploited, exploitation time, types of tools to be used, etc. Based on these exploitation conditions, by comparison, the exploitation scheme is chosen which seems most relevant. The subsurface deposit is then exploited by recovering materials, by modifying the tools used, by modifying the material recovery techniques, etc.

The invention also relates to a computer program product that can be downloaded from at least one of a communication network and storage on a computer-readable medium and execution by a processor. This program comprises program code instructions for implementing the method as described above, when the program is run on a computer.

The invention claimed is:

1. A method for exploiting a subsurface deposit including, at least one geological outcrop, comprising:
   acquiring at least two georeferenced photographs of the at least one geological outcrop;
   constructing a three-dimensional representation of the at least one geological outcrop from the at least two georeferenced photographs using a reconstruction algorithm including determining at least one parameter relating to the at least two georeferenced photographs, determining a depth of the at least one geological outcrop by using the at least two georeferenced photographs of the geological outcrop and the at least one parameter relating to the at least two georeferenced photographs and constructing the three-dimensional representation as a function of the depth of the at least one geological outcrop and from the at least two georeferenced photographs;
   determining at least one characteristic of the at least one geological outcrop using the three-dimensional representation of the at least one geological outcrop;
   constructing a geological model of the subsurface deposit by using the at least one characteristic of the at least one geological outcrop;
   performing a flow simulation of injected fluids and hydrocarbon fluids in the subsurface deposit based on the geological model; and
   exploiting the subsurface deposit including at least one geological outcrop based on using the flow simulation to place and drill at least one of an exploration and a production wells into the subsurface deposit including that at least one geological outcrop.

2. A method according to claim 1, wherein:
   the at least one characteristic of the at least one geological outcrop is at least one of a geological, a geometrical, a statistical and a geostatistical nature.

3. A method according to claim 2, wherein:
   the at least one characteristic of the at least one geological outcrop is chosen from a definition of surfaces defining geological units of the at least one geological outcrop, a definition of surfaces of at least one of the fault lines and fractures, a geometry of the different geological bodies and a definition of sedimentary facies.

4. A method according to claim 1, comprising:
   determining the at least one characteristic of the at least one geological outcrop by applying an image processing method to the three-dimensional representation.

5. A method according to claim 1, comprising:
   analyzing the three-dimensional representation statistically to determine at least one set of geostatistical parameters to constrain the geological model.

6. A method according to claim 5, comprising:
   analyzing at least one dimension of sedimentary bodies, heterogeneities, fault lines and fractures of the at least one geological outcrop.

7. A method according to claim 1, comprising:
   acquiring the at least two georeferenced photographs from at least one of the ground and from the air.

8. A method according to claim 2, comprising:
   acquiring the at least two georeferenced photographs from at least one of the ground and from the air.

9. A method according to claim 3, comprising:
   acquiring the at least two georeferenced photographs from at least one of the ground and from the air.

10. A method according to claim 4, comprising:
acquiring the at least two georeferenced photographs from at least one of the ground and from the air.

11. A method according to claim 5, comprising:
acquiring the at least two georeferenced photographs from at least one of the ground and from the air.

12. A method according to claim 6, comprising:
acquiring the at least two georeferenced photographs from at least one of the ground and from the air.

13. A method in accordance with claim 1 comprising:
using the flow simulation to choose at least one of fluids to be injected and fluids to be recovered.

14. A method in accordance with claim 1 comprising:
using the flow simulation to make production forecasts.

15. A computer program product stored on a non-transitory computer-readable medium which is executed by a processor, comprising program code instructions for implementing a method for exploiting a subsurface deposit including at least one geological outcrop, comprising:
acquiring at least two georeferenced photographs of the at least one geological outcrop, constructing a three-dimensional representation of the at least one geological outcrop from the at least two georeferenced photographs using a reconstruction algorithm including determining at least one parameter relating to the at least two georeferenced photographs, determining a depth of the at least one geological outcrop by using the at least two georeferenced photographs of the geological outcrop and at least one parameter relating to the at least two georeferenced photographs and constructing the three-dimensional representation as a function of the depth of the at least one geological outcrop and from the at least two georeferenced photographs;
determining at least one characteristic of the at least one geological outcrop using the three-dimensional representation of the at least one geological outcrops constructing a geological model of the subsurface deposit by using the at least one characteristic of the at least one geological outcrop;
performing a flow simulation of injected fluids and hydrocarbon fluids in the subsurface deposit based on the geological model; and
exploiting the subsurface deposit based on the flow simulation to place and drill at least one of an exploration and a production wells into the subsurface deposit including the at least one geological outcrop.

* * * * *